US012684697B2

(12) United States Patent
    Arai et al.

(10) Patent No.: US 12,684,697 B2
(45) Date of Patent: Jul. 14, 2026

(54) METHOD FOR MANUFACTURING WIRING BOARD

(71) Applicant: FUJIKURA PRINTED CIRCUITS LTD., Tokyo (JP)

(72) Inventors: Daisuke Arai, Chiba (JP); Shigeki Otsuka, Tokyo (JP)

(73) Assignee: FUJIKURA PRINTED CIRCUITS LTD., Tokyo (JP)

( * ) Notice: Subject to any disclaimer, the term of this patent is extended or adjusted under 35 U.S.C. 154(b) by 361 days.

(21) Appl. No.: 18/257,579

(22) PCT Filed: Jan. 19, 2022

(86) PCT No.: PCT/JP2022/001853

§ 371 (c)(1),
(2) Date: Jun. 14, 2023

(87) PCT Pub. No.: WO2022/163469

PCT Pub. Date: Aug. 4, 2022

(65) Prior Publication Data

US 2024/0040708 A1     Feb. 1, 2024

(30) Foreign Application Priority Data

Jan. 26, 2021    (JP) ................................. 2021-010413

(51) Int. Cl.
*H05K 3/28* (2006.01)
*H05K 3/303* (2026.01)
*H05K 3/46* (2006.01)

(52) U.S. Cl.
CPC ............. *H05K 3/288* (2013.01); *H05K 3/281* (2013.01); *H05K 3/305* (2013.01); *H05K 3/4632* (2013.01);

(Continued)

(58) Field of Classification Search
CPC ...... H05K 3/288; H05K 3/305; H05K 3/4632; H05K 2203/0228; H05K 2203/0264; H05K 3/281
See application file for complete search history.

(56) References Cited

U.S. PATENT DOCUMENTS

2010/0271788 A1* 10/2010 Inoue ..................... H05K 3/284
                                                       361/748
2016/0315134 A1* 10/2016 Nishido .............. H10K 59/131
2020/0238678 A1*  7/2020 Makino .......... H05K 2203/0264

FOREIGN PATENT DOCUMENTS

CN       108886871 A    11/2018
CN       111498579 A     8/2020

(Continued)

OTHER PUBLICATIONS

Kawakita et al, "A study of the insulator material for the interconnection in ALIVH/sup (R)/ substrate", Proceedings International Symposium on Advanced Packaging Materials Processes, Properties and Interfaces (IEEE Cat. No. 01TH8562), Braselton, GA, USA, 2001, pp. 159-164. (Year: 2001).*

(Continued)

*Primary Examiner* — A. Dexter Tugbang
(74) *Attorney, Agent, or Firm* — Osha Bergman Watanabe & Burton LLP

(57) ABSTRACT

A method of manufacturing a wiring board includes covering a part of a wiring disposed on a base material for the wiring board by disposing a separation layer on the base material; covering the wiring and the separation layer by disposing a cover lay including a removal portion on the base material; and removing the removal portion of the cover lay laminated on the separation layer and exposing a part of the wiring from the cover lay by peeling the separation layer from the base material.

4 Claims, 6 Drawing Sheets

(52) U.S. Cl.
CPC ................ *H05K 2203/0228* (2013.01); *H05K*
*2203/0264* (2013.01)

(56) References Cited

FOREIGN PATENT DOCUMENTS

| | | | |
|----|----|----|----|
| JP | H02-183589 | A | 7/1990 |
| JP | 2005-327982 | A | 11/2005 |
| JP | 2008-140995 | A | 6/2008 |
| JP | 2010-050158 | A | 3/2010 |
| JP | 2016-208020 | A | 12/2016 |
| JP | 2017152493 | A * | 8/2017 |
| KR | 20050092131 | A | 9/2005 |
| KR | 10-2021-0007159 | A | 1/2021 |

OTHER PUBLICATIONS

International Search Report issued in corresponding International Application No. PCT/JP2022/001853 mailed Mar. 15, 2022 (3 pages).

\* cited by examiner

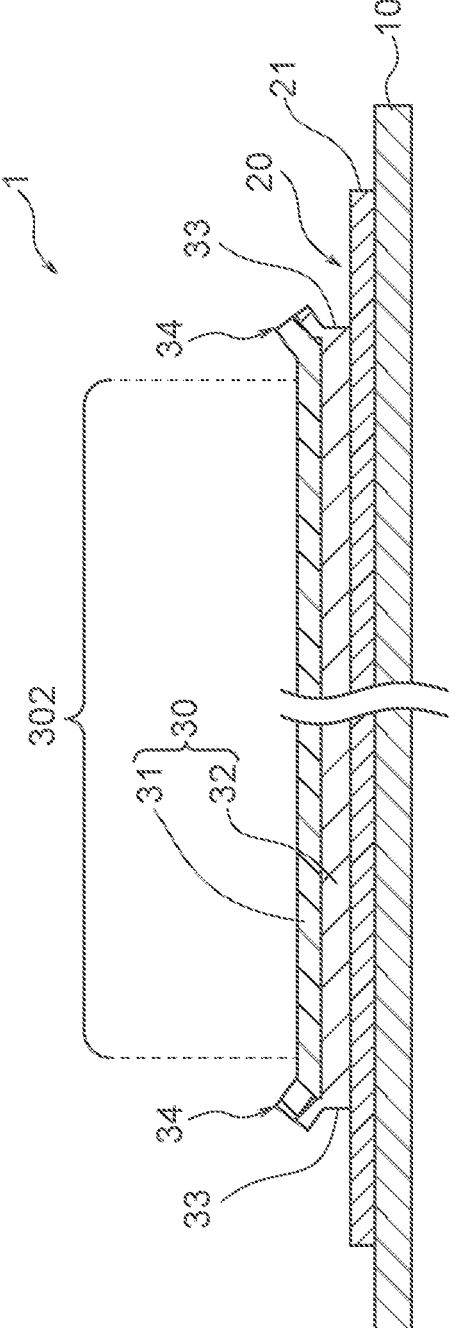
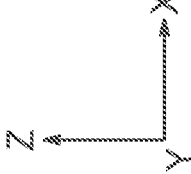
Figure 2

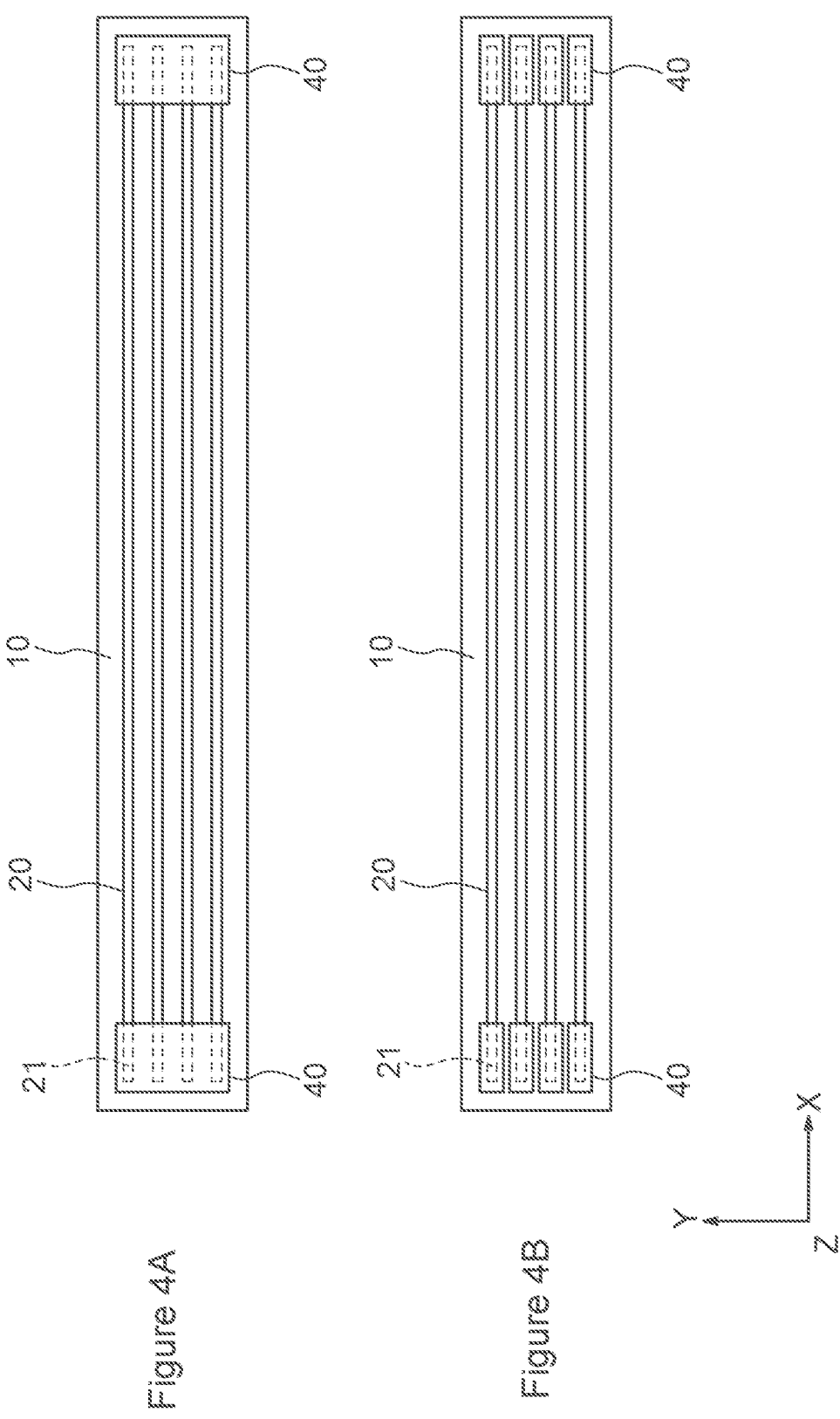

METHOD FOR MANUFACTURING WIRING BOARD

CROSS-REFERENCE TO RELATED APPLICATIONS

This application claims priority from Japanese Patent Application No. 2021-010413 filed on Jan. 26, 2021, the content of which is incorporated herein by reference in its entirety.

BACKGROUND

Technical Field

The present invention relates to a method of manufacturing a wiring board and a wiring board.

Description of Related Art

A method of manufacturing flexible printed circuit board (FPC) that positions openings formed in a cover lay film with respect to terminals of a conductive pattern by inserting positioning pins into positioning holes provided in a cover lay film is known (for example, refer to Patent Document 1).

PATENT DOCUMENT

[Patent Document 1] JP-A-2005-327982

For manufacturing a long FPC, a long cover lay film is also required to be used. Since the cover lay film is thin and soft, the longer the length, the more difficult it is to handle and the larger the variation in dimensions. Therefore, the above-described method can fail to form terminals with high accuracy because of the difficulty in aligning the position of the opening of the cover lay film with respect to the base film accurately.

SUMMARY

One or more embodiments of the present invention provide a method of manufacturing a wiring board in which terminals can be accurately formed.

[1] A method of manufacturing a wiring board including a base material, a wiring disposed on the base material, and a cover lay laminated on the base material so as to cover the wiring, the method comprises a first step of preparing the base material on which the wiring is disposed; a second step of disposing a separation layer on the base material so as to cover a part of the wiring; a third step of disposing the cover lay on the base material so as to cover the wiring and the separation layer; and a fourth step of removing a removal portion of the cover lay laminated on the separation layer and exposing a part of the wiring from the cover lay by peeling the separation layer from the base material.

[2] The separation layer may be a fine adhesive film having a peel strength with respect to the base material smaller than a peel strength of the cover lay with respect to the base material, and the second step may include attaching the fine adhesive film on the base material so as to cover a part of the wiring.

[3] The fourth step may include peeling the separation layer from the base material while pressing a portion of the cover lay other than the removal portion by a pressing means (i.e., a pressor).

[4] The method may further include a fifth step of exposing the separation layer from an end portion of the wiring board by cutting the cover lay, the separation layer, and the base material before the fourth step.

[5] The method may include a sixth step of covering an edge portion of the cover lay from which the removal portion has been removed with a resin material after the fourth step.

[6] The length of the printed wiring board in the longitudinal direction may be equal to or greater than 600 mm.

[7] A wiring board according to one or more embodiments of the present invention comprises a base material, a wiring disposed on the base material, and a cover lay laminated on the base material so as to cover the wiring, wherein an open portion exposing a part of the wiring is formed on the cover lay, and the cover lay has burrs that are not in contact with the base material at an edge portion of the cover lay along the open portion.

[8] The wiring board may include a resin material covering the edge portion.

[9] The length of the printed wiring board may be equal to or greater than 600 mm.

In one or more embodiments, a cover lay is laminated on a release layer disposed so as to cover a wiring on a base material, and the release layer is peeled off to expose the wiring, thereby forming a terminal. Since the release layer only needs to be disposed in a portion corresponding to the terminal in the wiring pattern, the release layer can be disposed with high positional accuracy with respect to the base material regardless of the size of the cover lay. Therefore, in such embodiments, the terminal portion can be formed with high accuracy.

BRIEF DESCRIPTION OF DRAWINGS

FIG. 2 is a cross-sectional view of a printed wiring board according to one or more embodiments, taken along II-II line of FIG. 1.

FIG. 4A is a plan view corresponding to FIG. 3B, and FIG. 4B is a plan view corresponding to FIG. 3B while showing a modification of the method of manufacturing a printed wiring board in one or more embodiments.

DETAILED DESCRIPTION OF EMBODIMENTS

Figure 1:
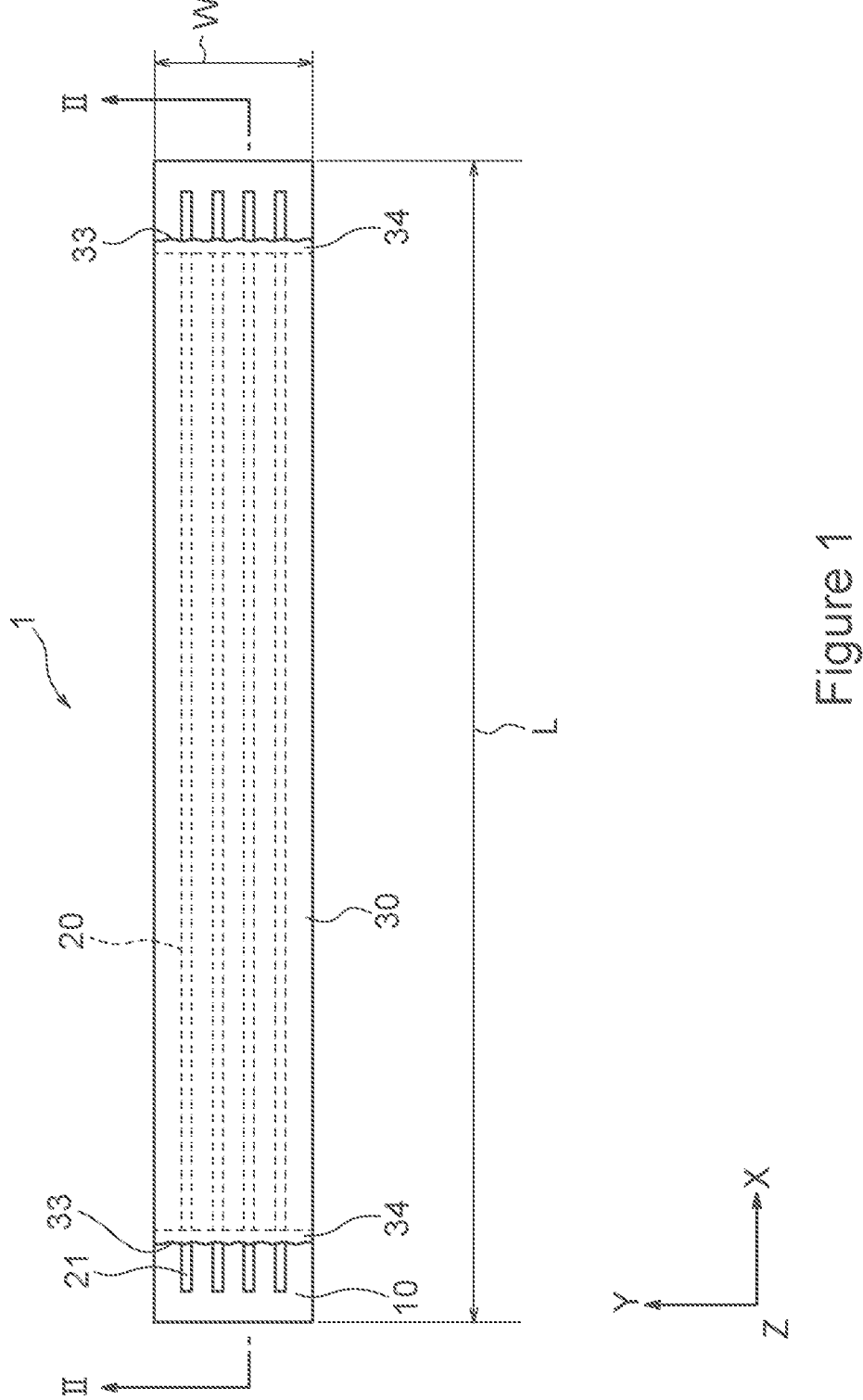
FIG. 1 is a plan view showing a printed wiring board according to one or more embodiments.

Hereinafter, embodiments of the present invention will be described with reference to the drawings. However, the scope of the invention is not limited to the disclosed embodiments. In the following description, the same components are denoted by the same reference numerals. This holds true for names and functions. Therefore, detailed descriptions thereof will not be repeated.

FIG. 1 is a plan view showing a printed wiring board according to one or more embodiments of the present invention.

The printed wiring board 1 in one or more embodiments is a flexible printed circuit board (FPC) having a long rectangular shape as a whole. Although not particularly limited, the length L along the longitudinal direction (X direction in the drawing) of the printed wiring board 1 is 600 mm~5000 mm (600 mm≤L≤5000 mm) and the width W along the lateral direction of the printed wiring board 1 (Y direction in the drawing) is 1 mm~250 mm (1 mm≤W≤250 mm) in one or more embodiments.

Planar shape of the printed wiring board 1 is not limited to a rectangular shape only, any shape may be selected, for example, may have a branched shape extending branched into a plurality, in part. Further, the width of the printed wiring board 1 is not constant over the entire longitudinal direction in one or more embodiments, and the width of the printed wiring board 1 may be widened or narrowed in a part of the longitudinal direction.

Alternatively, the planar shape of the printed wiring board 1 may be a large rectangular shape that has a width W wider than 250 mm (250 mm<W≤1000 mm). The planar shape of the large printed wiring board is not particularly limited to the above, and may be any shape. It is sufficient that the imaginary rectangle circumscribing the planar shape of such a large printed wiring board has the length L and width W described above.

The printed wiring board 1 having such a long or large planar shape is used, for example, in applications of automobiles, industrial machines, medical devices, and the like. The application of the printed wiring board 1 is not particularly limited.

As illustrated in FIG. 2, the printed wiring board 1 includes a base film wiring patterns 20, and a cover lay 30. The base film 10 corresponds to an example of a "base material," the wiring patterns 20 corresponds to an example of a "wiring," and the cover lay 30 corresponds to an example of a "cover lay" in one or more embodiments of the present invention.

The base film 10 is flexible and has a long band shape. The base film 10 is made of an electrically insulating material such as a resin material. Although not particularly limited, examples of materials comprising the base film 10 include polyimide (PI), liquid crystal polymer (LCP), polyethylene terephthalate (PET), polyethylene naphthalate (PEN), polyetherimide (PEI), polyetheretherketone (PEEK), and aramid.

A plurality of wiring patterns 20 are formed on the base film 10. The wiring patterns 20 are made of a conductive material such as metal or carbon. Examples of the metal comprising the wiring patterns 20 include copper, silver, and gold. In one or more embodiments, copper is used as a material comprising the wiring patterns 20. The number of the wiring patterns 20 is not limited to a plurality, and may be one.

In one or more embodiments, as shown in FIG. 1, a plurality of wiring patterns 20 having the same length extend linearly along the X direction on the base film 10. The plurality of wiring patterns 20 are arranged in parallel to each other at equal intervals. The plurality of wiring patterns 20 are arranged so that their positions in the X-axis direction are equal to each other. Any of the number, shape, arrangement, and the like of the wiring patterns 20 may be set. Further, a wiring pattern may be formed on both surfaces of the base film 10, or a via hole or the like may be included in the wiring pattern.

Further, as shown in FIG. 1, terminals 21 are formed at both ends of each wiring pattern 20. The terminals 21 are connected to, for example, a connector provided on another printed wiring board, a cable, or the like, and the printed wiring board 1 is electrically connected to an external electronic circuit via the terminals 21. Note that the formation positions of the terminals 21 are not limited to the end portions of the wiring patterns 20, and any position in the wiring pattern 20 may be selected. The number of the terminals 21 in the wiring pattern 20 is not particularly limited.

As shown in FIG. 2, the cover lay 30 has a two-layer structure including a protection layer 31 and an adhesive layer 32. The cover lay 30 has an open portion 33 formed by removing an end portion of the cover lay 30, and the terminals 21 of the wiring patterns 20 are exposed from the open portion 33. The cover lay 30 also includes a burr 34 formed at an edge along the open portion 33. The open portion 33 corresponds to an example of an "open portion," and the burr 34 corresponds to an example of a "burr" in one or more embodiments of the present invention.

The protection layer 31 is a layer for protecting the wiring patterns 20. The protection layer 31 is a film that is flexible and has a long band shape. The protection layer 31 is made from an electrically insulating material such as a resin material. Although not particularly limited, materials comprising the protection layer 31 include polyimide (PI), liquid crystal polymer (LCP), polyethylene terephthalate (PET), polyethylene naphthalate (PEN), polyetherimide (PEI), polyetheretherketone (PEEK), and aramid.

The adhesive layer 32 is a layer for adhering the protection layer 31 to the upper surface of the base film 10. The adhesive layer 32 is made from, for example, an epoxy-based adhesive or an acrylic-based adhesive.

The material of the cover lay 30 is not particularly limited to the above. For example, the cover lay 30 may be formed using a dry film made of a photosensitive cover lay material instead of the resin film described above, or the cover lay 30 may be formed by applying a liquid photosensitive cover lay material onto the base film 10 and then exposing and developing the coated material. Alternatively, the cover lay 30 may be formed by printing a liquid cover lay ink on the base film 10.

Alternatively, the cover lay 30 may be formed of a so-called solder resist. Specifically, the cover lay 30 may be formed using a dry film made of a photosensitive resist material. Alternatively, the cover lay 30 may be formed by applying a liquid photosensitive resist material on the base film 10, and then exposing and developing the liquid photosensitive resist material. Alternatively, the cover lay 30 may be formed by printing a liquid solder resist ink on the base film 10.

Specific examples of the photosensitive cover lay material and the photosensitive resist material include those using polyester, epoxy, acrylic, polyimide, polyurethane, and the like. Specific examples of the cover lay cover and the solder resist ink are based on polyimide and epoxy.

The burr 34 is a portion concomitantly formed when the cover lay 30 is cut in a method of manufacturing the printed wiring board 1 to be described later. The burr 34 protrudes from the main body 302 of the cover lay 30 adhered to the base film 10 and floats from the base film 10, and is not adhered to the base film 10.

Hereinafter, a method of manufacturing the printed wiring board 1 according to one or more embodiments will be described with reference to FIG. 3A to FIG. 3H, FIG. 4A, and FIG. 4B. FIG. 3A to FIG. 3H are cross-sectional views showing a method of manufacturing a printed wiring board according to one or more embodiments. FIG. 4A is a plan view corresponding to FIG. 3B. FIG. 4B is a plan view corresponding to FIG. 3B, while showing a modification of the method of manufacturing a printed wiring board according to one or more embodiments.

Figures 3A, 3B, 3C, 3D:
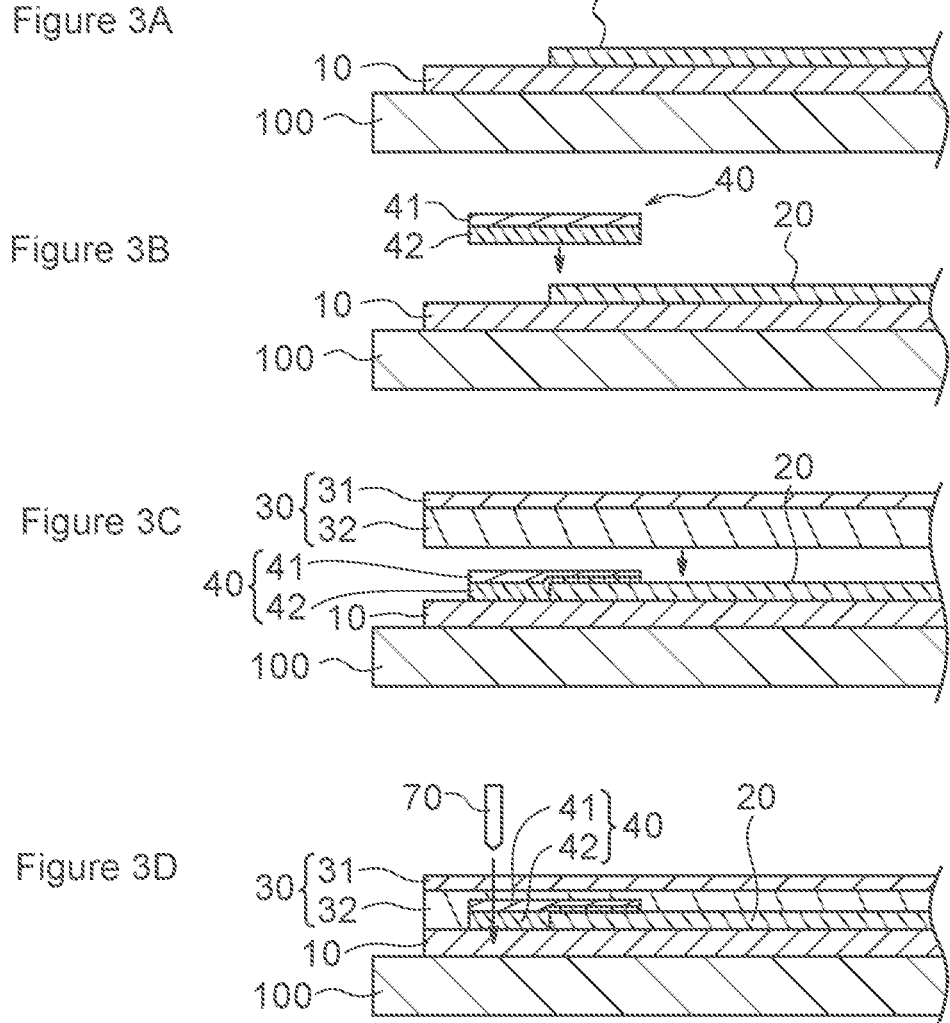
FIG. 3A to FIG. 3H are cross-sectional views showing a method of manufacturing a printed wiring board according to one or more embodiments.

First, as shown in FIG. 3A, a base film 10 having one or a plurality of wiring patterns 20 formed thereon is prepared on a jig 100 (preparation step). A method of forming the wiring patterns 20 on the base film 10 may be a subtractive method, a semi-additive method, and the like and is not particularly limited. The preparation step corresponds to an example of the "first step" in one or more embodiments of the present invention.

Next, as shown in FIG. 3B, a rectangular fine adhesive film 40 is disposed on the base film 10 so as to cover a part of the wiring patterns 20 (separation layer disposing step). Specifically, as shown in FIG. 4A, the fine adhesive film 40 is disposed so as to cover a part of each wiring pattern 20 across the plurality of wiring patterns 20. At this time, the fine adhesive film 40 is arranged such that the long sides of the fine adhesive film 40 are orthogonal to the respective wiring patterns 20. The separation layer disposing step corresponds to an example of the "second step" in one or more embodiments of the present invention. Note that, as shown in FIG. 4B, the plurality of fine adhesive films 40 may be individually arranged with respect to the plurality of wiring patterns 20 so that one fine adhesive film 40 covers only one wiring pattern 20.

Although not particularly illustrated, the fine adhesive film 40 can be positioned on the base film 10 by inserting a positioning pin provided on the base film 10 into a through-hole formed in the fine adhesive film 40. Note that the fine adhesive film 40 may be positioned by image recognition.

As shown in FIG. 3B, the fine adhesive film 40 has a structure in which the substrate 41 and the adhesive layer 42 are laminated. In the separation layer disposing step, the fine adhesive film 40 is disposed on the base film 10 such that the adhesive layer 42 contacts the base film 10. The examples of material comprising the substrate 41 of the fine adhesive film 40 may include polyester and is not particularly limited. The examples of the adhesive layer 42 of the fine adhesive film 40 may include an acrylic pressure-sensitive adhesive and is not particularly limited.

The peel strength of the fine adhesive film 40 with respect to the base film is weaker than the peel strength of the adhesive layer 32 with respect to the base film 10 measured under the same conditions. The test methods for peel strength include JIS K 6854-1 and 90 degree peel test defined by JIS Z 0237.

The material of the fine adhesive film 40 may be other material that satisfies the above-mentioned relationship of peel strength. Alternatively, instead of the fine adhesive film 40, a separation layer may be formed by applying a resin material onto the base film 10 so as to cover a part of the wiring pattern 20, and then curing.

Next, as shown in FIG. 3C, the cover lay 30 is disposed on the base film so as to cover the wiring patterns 20 and the fine adhesive film 40, and the adhesive layer 32 is brought into contact with the base film 10 (cover lay forming step). At this time, the adhesive layer 32 does not come into contact with a portion of the wiring patterns 20 where the fine adhesive film 40 is disposed.

As long as the cover lay 30 has a size capable of covering the wiring pattern 20 and the fine adhesive film 40, the size and shape of the cover lay 30 are not limited. While the cover lay 30 is pressed against the base film 10, the entire cover lay 30 is heated to cure the adhesive layer 32 and adhere the protection layer 31 to the base film 10. The cover lay forming step corresponds to an example of the "third step" in one or more embodiments of the present invention.

Figures 3E, 3F, 3G, 3H:
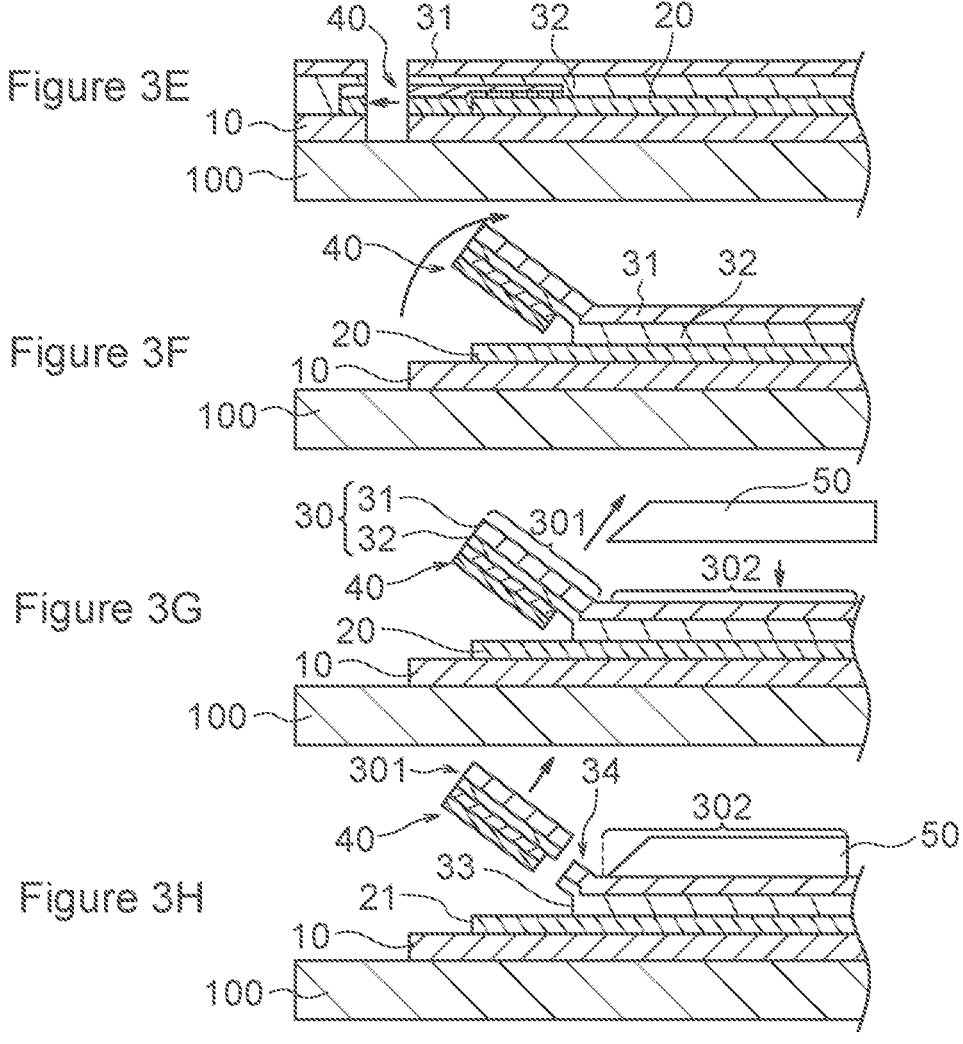

Next, as shown in FIG. 3D, the cover lay 30 and the base film 10 are cut by using a mold 70 for outer shape processing in accordance with the outer shape of the printed wiring board 1 to be manufactured (outer shape forming step). At this time, as shown in FIG. 3D and FIG. 3E, the cover lay 30 and the base film 10 including the fine adhesive film 40 are cut at the place where the fine adhesive film 40 is laminated, and the end face of the fine adhesive film 40 is exposed from the cover lay 30 in the X-axis direction. The outer shape forming step corresponds to an example of the "fifth step" in one or more embodiments of the present invention. The method of forming the outer shape of the printed wiring board 1 is not particularly limited to the above and may use a laser, for example.

This outer shape forming step may be omitted in a case where the fine adhesive film 40 is disposed on the base film 10 so as to expose the end face of the fine adhesive film 40 or a part of the fine adhesive film 40 from the printed wiring board 1 in the above-described separation layer disposing step.

Next, as shown in FIG. 3F, the fine adhesive film 40 and the portion of the cover lay 30 laminated on the fine adhesive film 40 are peeled off from the base film 10. At this time, since the peel strength of the fine adhesive film 40 with respect to the base film 10 is weaker than the peel strength of the adhesive layer 32 with respect to the base film 10, only the fine adhesive film 40 is peeled from the base film 10, and the adhesive layer 32 is not peeled from the base film 10.

Then, as shown in FIG. 3G and FIG. 3H, the plate-shaped pressing jig 50 is arranged in the main body 302 other than the removal portion 301 laminated on the fine adhesive film 40 in the cover lay 30, and the main body 302 is held in the base film 10. While the main body 302 is pressed by the pressing jig 50, the removal portion 301 and the fine adhesive film 40 are pressed against the pressing jig 50, and then the removal portion 301 and the fine adhesive film 40 are separated from the main body 302 (peeling step). Note that the pressing jig 50 is not particularly limited to this, and may be a cutting tool such as a blade of a cutter knife.

As a result, the open portion 33 is formed at a position where the removal portion 301 was present in the cover lay 30. In addition, a part of the wiring patterns is exposed from the open portion 33 to form the terminals 21. Further, in the cover lay 30, a portion that has been peeled off together with the fine adhesive film but has not been cut from the main body 302 is formed as the burr 34 described above. The removal portion 301 corresponds to an example of a "removal portion," the peeling step corresponds to an example of a "fourth step," and the pressing jig corresponds to an example of a "pressing means" or "pressor" in one or more embodiments of the present invention.

In this peeling step, the timing at which the fine adhesive film 40 is peeled from the base film 10 and the timing at which the removal portion 301 of the cover lay 30 is separated in a state of being pressed by the pressing jig 50 may be substantially the same. Specifically, while the pressing jig 50 is disposed on the main body 302 of the cover lay 30 and the main body 302 is held down by the pressing jig 50, the fine adhesive film 40 may be peeled off from the base film 10, and at the same time, the removal portion 301 of the cover lay 30 and the fine adhesive film may be separated from the main body 302.

In addition, in one or more embodiments, the peeling step does not involve use of the pressing jig 50 in a case where the removal portion 301 of the cover lay can be separated without using the pressing jig 50.

Finally, the pressing jig 50 is removed from above the cover lay 30. As described above, the printed wiring board 1 according to one or more embodiments is manufactured.

In the method of manufacturing the printed wiring board 1 according to one or more embodiments, the cover lay 30 is laminated on the fine adhesive film disposed so as to cover the wiring patterns 20 on the base film 10, and the fine adhesive film 40 is peeled off to expose the wiring patterns 20, thereby forming the terminals 21. Since the fine adhesive film 40 only needs to be disposed in a portion corresponding to the terminals 21 in the wiring patterns 20, it can be disposed with high positional accuracy with respect to the base film 10 regardless of the size of the cover lay 30. Therefore, the terminals 21 can be formed with high accuracy.

In particular, in the case of manufacturing a long printed wiring board, handling of a cover lay made of a thin and soft material becomes difficult, and the influence of dimensional error of the base film becomes large. That makes accurate alignment of the cover lay with respect to the base film difficult to decrease the productivity of the printed wiring board and cause appearance defects of cover lay such as folds and creases.

On the other hand, in the manufacturing method of the printed wiring board 1 according to one or more embodiments, after the cover lay 30 having no opening is simply laminated on the base film 10, the cover lay 30 and the base film are cut to form an outer shape. That allows accurate alignment of the cover lay with respect to the base film 10 unnecessary. Therefore, for manufacturing the long printed wiring board 1, it is possible to prevent or reduce a decrease in productivity of the printed wiring board 1 and occurrence of an appearance defect of the cover lay 30.

Further, in one or more embodiments, the lengths of the plurality of wiring patterns 20 are equal, and the wiring patterns 20 are arranged at the same positions in the X-axis direction. This allows to form the terminals 21 having the same shape for each wiring patterns 20 by arranging the rectangular fine adhesive film 40 so as to straddle the wiring patterns 20 and to be orthogonal to the wiring patterns 20, as shown in FIG. 4A. That is, arranging the fine adhesive film 40 once enables to form the terminals 21 of the plurality of wiring patterns 20 at once. Therefore, the workability is improved as compared with the case where one fine adhesive film 40 is arranged in one wiring pattern 20.

Figure 5:
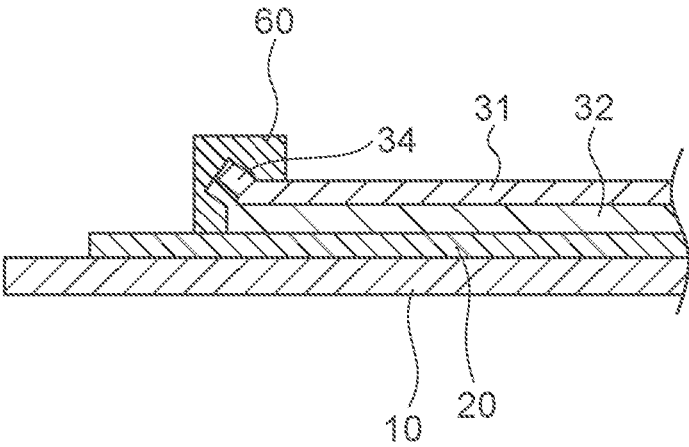
FIG. 5 is a cross-sectional view showing a modification of the printed wiring board according to one or more embodiments.

FIG. 5 is a cross-sectional view showing a modification of the printed wiring board according to one or more embodiments.

As shown in FIG. 5, the printed wiring board 1 in one or more embodiments may have a sealing resin 60 formed so as to cover the burr 34 of the cover lay 30. The material composed of the sealing resin 60 can be exemplified epoxy resin, acrylic resin, polyester resin, urethane resin, vinyl resin, silicone resin, phenol resin, polyimide resin, and the like. The sealing resin 60 corresponds to an example of a "resin material" in one or more embodiments of the present invention.

In order to form the sealing resin 60, in the method of manufacturing the printed wiring board 1 according to one or more embodiments, after the peeling step, the sealing resin material is applied by using a dispenser or the like so as to cover the burr 34. Curing the applied sealing resin material enables to form the sealing resin 60 (sealing resin forming step). The sealing resin forming step corresponds to an example of the "sixth step" in one or more embodiments of the present invention.

Since the printed wiring board 1 includes the sealing resin 60, as shown in FIG. 5, the space between the burr 34 and the base film 10 is filled with the sealing resin 60. Accordingly, when the terminals 21 are plated in a later step, the plating solution does not flow between the burr 34 and the base film 10. Therefore, it is possible to reduce the liquid stain by the plating solution flowing into the space between the burr 34 and the base film 10 and the occurrence of appearance defects of the printed wiring board 1.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

EXPLANATIONS OF LETTERS OR NUMERALS

1 . . . Printed wiring board
10 . . . Base film
20 . . . Wiring patterns
21 . . . Terminals
30 . . . Cover lay
31 . . . Protection layer
32 . . . Adhesive layer
33 . . . Open portion
34 . . . Burr
301 . . . Removal portion
302 . . . Main body
320 . . . Adhesive
40 . . . Fine adhesive film
50 . . . Pressing jig
60 . . . Sealing resin
70 . . . Mold
100 . . . Jig

The invention claimed is:
1. A method of manufacturing a wiring board, the method comprising:
(a) covering a part of a wiring disposed on a base material for the wiring board by disposing a separation layer on the base material;
(b) covering the wiring and the separation layer by disposing a cover lay including a removal portion on the base material; and
(c) removing the removal portion of the cover lay laminated on the separation layer and exposing a part of the wiring from the cover lay by peeling the separation layer from the base material, wherein
step (c) includes peeling the separation layer from the base material while pressing a portion of the cover lay other than the removal portion by a presser, and removing the removal portion by cutting a portion where the separation layer is not laminated on the cover lay.
2. The method according to claim 1, wherein
the separation layer is a slightly adhesive film having a peel strength with respect to the base material smaller than a peel strength of the cover lay with respect to the base material, and
step (a) includes attaching the slightly adhesive film on the base material.
3. The method according to claim 1, further comprising:
(d) exposing the separation layer from an end portion of the wiring board by cutting the cover lay, the separation layer, and the base material before step (c).
4. The method according to claim 1, further comprising:
(e) covering an edge portion of the cover lay from which the removal portion has been removed with a resin material after step (c).

* * * * *